United States Patent
Aga et al.

(10) Patent No.: US 11,300,613 B2
(45) Date of Patent: Apr. 12, 2022

(54) SYSTEMS AND METHODS FOR TESTING JITTER TOLERANCE

(71) Applicant: Credo Technology Group Limited, Grand Cayman (KY)

(72) Inventors: Arshan Aga, Mountain View, CA (US); Haoli Qian, Fremont, CA (US); Junqing Sun, Fremont, CA (US); James Bartenslager, San Jose, CA (US)

(73) Assignee: Credo Technology Group Limited, Grand Cayman (KY)

( * ) Notice: Subject to any disclaimer, the term of this patent is extended or adjusted under 35 U.S.C. 154(b) by 50 days.

(21) Appl. No.: 17/022,311

(22) Filed: Sep. 16, 2020

(65) Prior Publication Data
US 2022/0082618 A1    Mar. 17, 2022

(51) Int. Cl.
*G01R 31/317* (2006.01)
*G01R 29/26* (2006.01)

(52) U.S. Cl.
CPC ....... *G01R 31/31709* (2013.01); *G01R 29/26* (2013.01)

(58) Field of Classification Search
CPC ........................ G01R 31/31709; G01R 29/26
USPC ........................................ 324/613, 612, 600
See application file for complete search history.

(56) References Cited

U.S. PATENT DOCUMENTS

| | | | | |
|---|---|---|---|---|
| 9,088,399 | B1* | 7/2015 | Poon | G01R 31/31709 |
| 9,222,972 | B1* | 12/2015 | Ding | G01R 31/31709 |
| 2016/0334833 | A1* | 11/2016 | Kumar | G01R 31/31709 |

OTHER PUBLICATIONS

Anritsu. "Best Practical Jitter Tolerance Testing with MP1800A", MP1800A Series, Signal Quality Analyzer.
Emami, Azita. "Clock Recovery" Lecture 17: Professor M. Horowitz Computer Systems Laboratory, Stanford University 2001. Lecture.
Agilent Technologies. "Understanding Jitter and Wander Measurements and Standards" Second Edition.
Agilent Technologies. "Jitter Fundamentals: Jitter Tolerance Testing with Agilent 81250 ParBERT".

\* cited by examiner

*Primary Examiner* — Giovanni Astacio-Oquendo
(74) *Attorney, Agent, or Firm* — Ramey; Daniel J. Krueger

(57) ABSTRACT

A method of assessing the ability of one or more multi-die circuit elements to tolerate the presence of jitter in intra-package. The method includes: providing a first die having a set of transmitters for digital communications, the set of transmitters comprising a first transmitter and a second transmitter; providing a second die having a set of receivers for digital communications; providing a performance monitor; coupling, using an intra-package trace, a first transmit signal from the first transmitter to a receiver of the set of receivers; coupling a second transmit signal from the second transmitter to an external pin; supplying an input signal that induces jitter in the first and second transmit signals; measuring jitter in the second transmit signal via the external pin; and determining, using the performance monitor, a performance characteristic of the second die.

27 Claims, 11 Drawing Sheets

SYSTEMS AND METHODS FOR TESTING JITTER TOLERANCE

TECHNICAL FIELD

This application pertains generally to jitter testing of electronic components, and particularly to jitter tolerance testing of components within multi-die integrated circuits.

BACKGROUND

In the quest for ever smaller electronics, multi-die integrated circuits are becoming less rare. Attempts to evaluate the ability of die components to tolerate jitter in signaling with other dies of a multi-die integrated circuit have not been wholly successful.

SUMMARY

Accordingly, there are disclosed herein systems and methods for minimally invasive jitter tolerance testing.

One illustrative embodiment of this disclosure is a method of assessing the ability of one or more circuit elements to tolerate the presence of jitter in received signals. The method includes: providing a first die having a set of transmitters for digital communications, the set of transmitters comprising a first transmitter and a second transmitter; providing a second die having a set of receivers for digital communications; providing a performance monitor; coupling, using an intra-package trace, a first transmit signal from the first transmitter to a receiver of the set of receivers; coupling a second transmit signal from the second transmitter to an external pin; supplying an input signal that induces jitter in the first and second transmit signals; measuring jitter in the second transmit signal via the external pin; and determining, using the performance monitor, a performance characteristic of the second die.

Another illustrative embodiment of this disclosure is a jitter tolerance testing system that comprises a package and a test controller. The package includes: a first die having a first transmitter and a second transmitter; a second die having a receiver and a performance monitor; a signal path coupling a first transmit signal from the first transmitter to the receiver; and an external pin making a second transmit signal from the second transmitter available to the test controller. A reference signal from the test controller to the first and second transmitter controls the frequency of operation of the transmitters. The test controller includes: a signal generator that supplies an input signal to the package that supplies the reference frequency and provides the ability to induce jitter in the first and second transmit signals; a jitter measurement circuit that measures jitter in the second transmit signal; and a processor that controls the reference frequency sent to the die, obtains the measured jitter from jitter measurement circuit, and obtains a performance indicator signal from the performance monitor, the performance indicator signal indicative of an ability of one or more components of the second die to retrieve data from the first transmit signal despite the jitter.

In accordance with another illustrative embodiment of this disclosure, a jitter tolerance testing system comprises: a first die having a transmitter; a second die having a receiver and a performance monitor; a signal path coupling a transmit signal from the transmitter to the receiver, the signal path configured to mimic a predetermined degree of cross talk or a predetermined degree of insertion loss; a signal generator that supplies an input signal at a reference frequency to induce the transmitter to transmit a transmit signal at a frequency proportional to the reference frequency to the receiver; and a processor that controls the input signal and obtains a performance indicator signal from the performance monitor, the performance indicator signal indicative of an ability of one or more components of the second die to retrieve data from the transmit signal despite the cross talk or the insertion loss.

Another illustrative embodiment of this disclosure is a jitter tolerance testing method that comprises: providing a first die having a transmitter; providing a second die having a set of receivers for digital communications; providing a performance monitor; configuring an intra-package trace to mimic a predetermined degree of cross talk or a predetermined degree of insertion loss; supplying an input signal at a reference frequency that causes the transmitter to emit a transmit signal at a frequency proportional to the reference frequency; coupling, using the intra-package trace, the transmit signal from the transmitter to a receiver of the set of receivers; and determining, using the performance monitor, a performance characteristic of the second die.

DETAILED DESCRIPTION

Please note that the drawings and corresponding detailed description are provided for explanatory purposes, not to limit the disclosure. To the contrary, they provide the foundation for understanding all modifications, equivalents, and alternatives falling within the scope of the appended claims. In order to enhance assimilation of various inventive concepts of this disclosure, not all device components are depicted in every figure.

Figure 1:
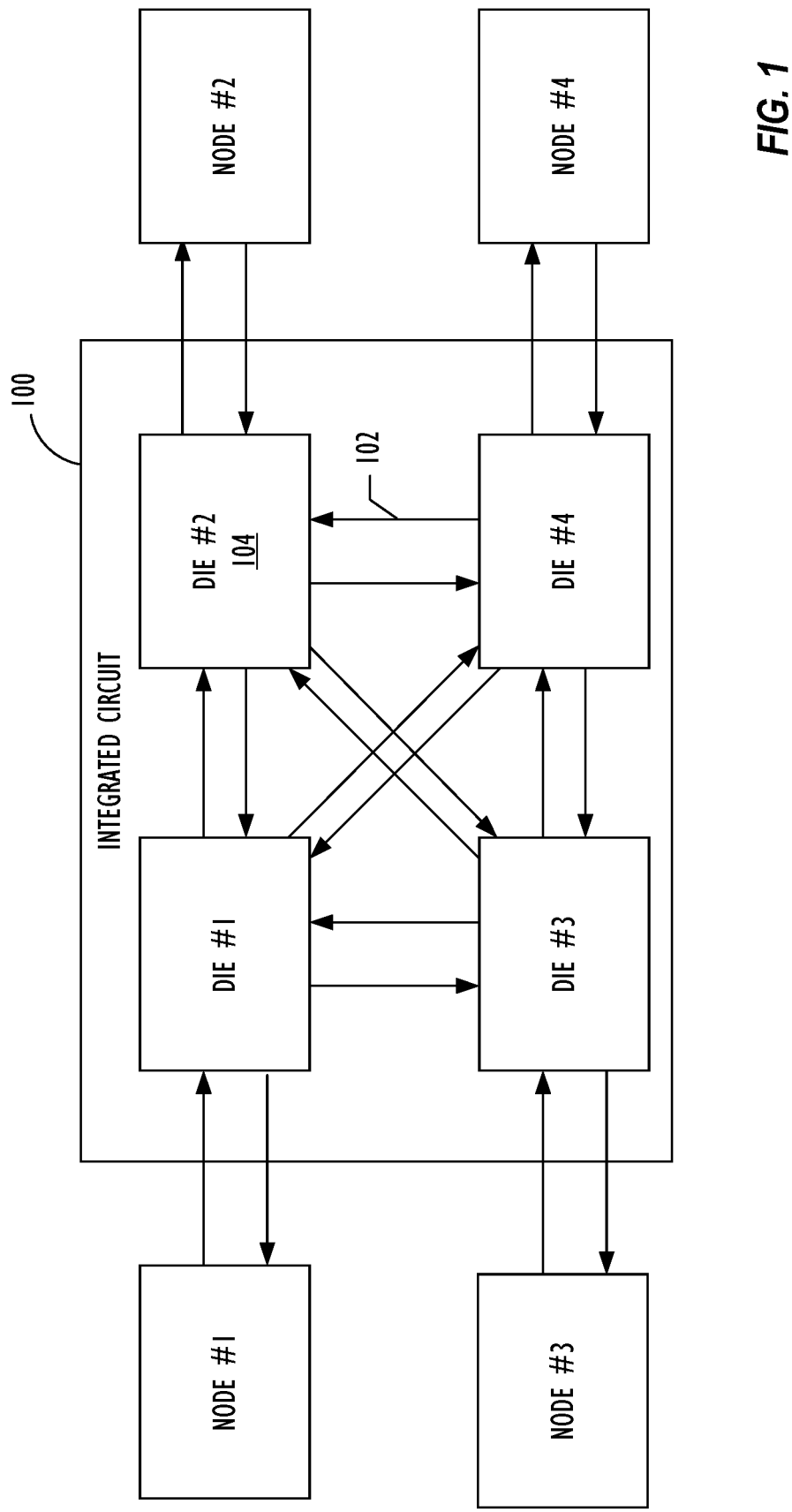
FIG. 1 is a block diagram of an illustrative multi-die integrated circuit.

FIG. 1 is an illustrative multi-die integrated circuit (IC) 100. A multi-die IC 100 can also be known as a package within this disclosure. In multi-die IC 100, each die (e.g., DIE #1) can send information to one or more other dies (e.g., DIE #2, 104) and receive information from one or more other dies at high speed. In addition, some or all these dies can communicate with one or more nodes (e.g., NODE #1) which are external to the IC 100.

In some embodiments, intra-package communications 102 occur in conformance with protocols and specifications known to those of skill, such as the ultra-short-reach (USR) standard and the extreme-short-reach (XSR) standard. In order to help ensure that a package 100 complies with various standards and protocols (e.g., ITU-T G.8262/Y.1362) it can be important to confirm that components (e.g., 104) within the package 100 are able to operate properly despite the presence of jitter. There are various ways measuring jitter tolerance. For example, a known amount of jitter (e.g., sinusoidal jitter) is introduced to a system (e.g., 100), a sent data signal is compared to a received data signal, and an error rate between what was sent and what was received is determined. In at least one embodiment of this disclosure, the error rate is a bit error rate (BER). In some embodiments, the error rate is a symbol error rate. When checking a device under test (DUT) (e.g., a receiver on a die) for jitter tolerance, varying degrees of sinusoidal jitter can be added at various frequencies and the receiver is evaluated as to its ability not exceed a BER ceiling for a given severity and frequency of jitter. In some jitter tolerance testing, jitter is introduced at a DUT's input instead of or in addition to jitter that is added to a signal sent to the DUT from another component (e.g., a transmit circuit). Regardless of where and how jitter is introduced, it is important that the jitter tolerance of the DUT be evaluated in conditions which are substantially similar to the conditions under which the DUT will be expected to operate during normal use.

Figure 2:
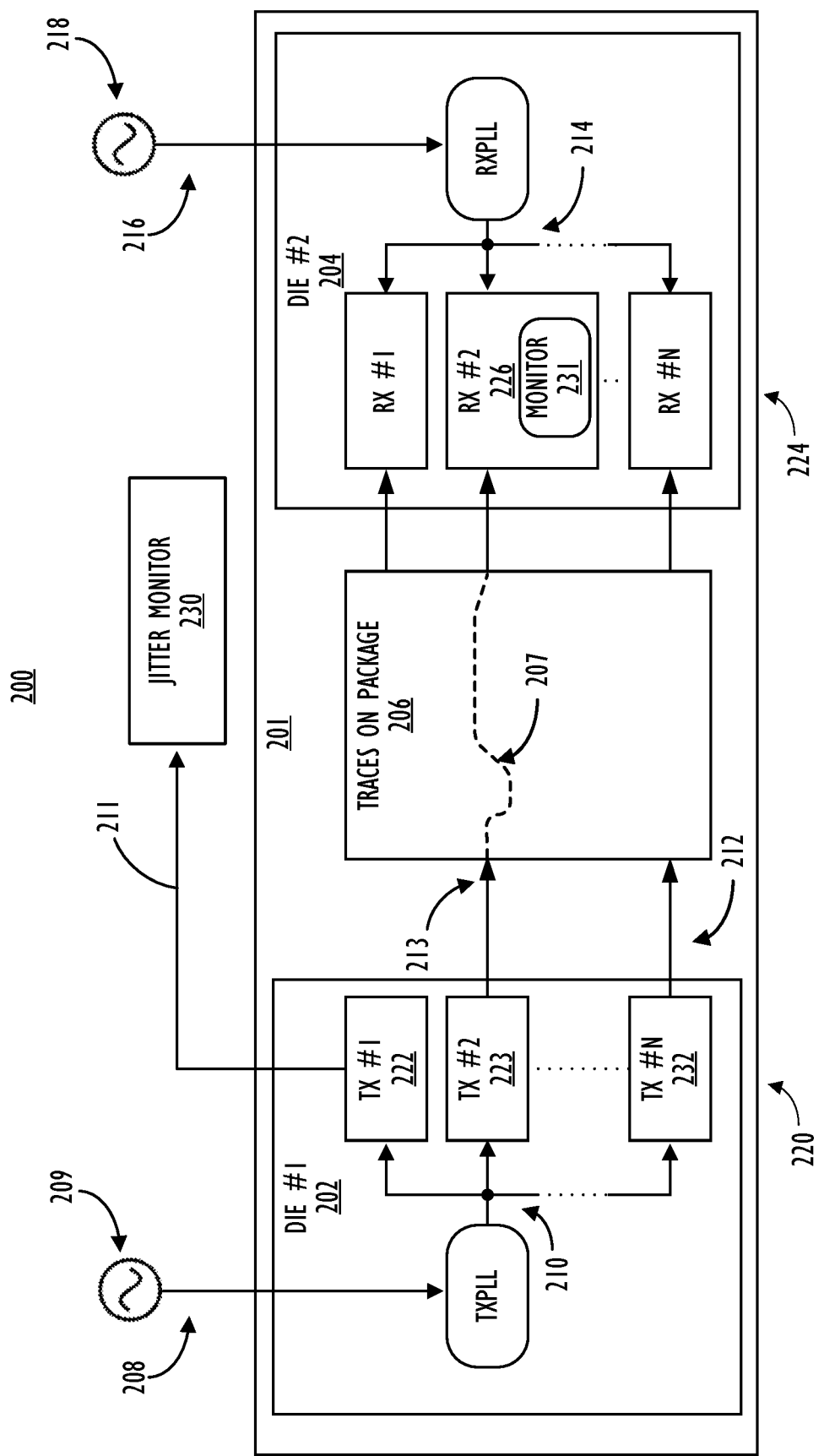
FIG. 2 shows an illustrative embodiment of a jitter tolerance testing system.

FIG. 2 shows an illustrative embodiment of jitter tolerance testing system 200. A first die 202 of a package 201 communicates with a second die 204 of package 201 through a plurality of intra-package traces 206. A first reference signal 208 from a first reference signal source 209 sets the reference frequency of a transmit phase locked loop (TXPLL) on the first die 202. In the example shown in FIG. 2, the reference signal source 209 resides outside package 201, but it will be understood by those of skill in the art that the signal source 209 could reside within the package 201 in one or more embodiments of this disclosure. The TXPLL outputs a first timing signal 210 (having a frequency that is proportional to the frequency of signal 208) to a plurality of transmitters (TX) 220. Transmitter TX #1 222 transmits a data signal to jitter monitor 230. Other transmitters 220 (e.g., TX #3, 232), transmit data signals (e.g., 212) to receivers (RX) 224 in the second die 204 through the traces 206. The frequency of the data signals 211, 212 is determined by the first timing signal 210. The frequency of the receivers (RX) 224 is governed by a second timing signal 214 emanating from the receive phase locked loop (RXPLL) whose timing is governed by a second reference signal 216 generated by a second reference signal source 218.

One or more of the traces 206 can be configured to mimic one or more adverse conditions under which multi-die integrated circuit 201 may be expected to operate. For example, a specific trace 207 may be designed in the integrated circuit 201 to have a certain insertion loss vs. frequency characteristic and a certain amount of cross talk with other components of the package 201, (e.g., adjacent lanes/traces). Insertion loss can be a loss of signal power resulting from the insertion of a device in a transmission line or pathway. Cross talk can include unwanted transfer of signals between communication channels.

In some embodiments, the data signal 211 of the first transmitter 222 can be sent off-chip to jitter monitor 230 instead of (or in addition to) being sent through the traces 206 on the package 201. The jitter monitor(s) 230 can measure the amount of jitter added to data signal 211 and data signal 212. Additionally, a performance monitor 231 within one or more of the receivers 224 can be used to monitor the performance (e.g., bit error rate) of the receiver(s) 224. In some embodiments, reference signal 208 and reference signal 216 emanate from different sources, as shown. A technical advantage of having the reference signals 208, 216 being differently sourced is that it enables tests to be performed that would not be possible if the reference signals 208, 216 were not independent.

To enhance assimilation of various inventive concepts of this disclosure, not all device components are depicted in every figure. Thus, although trace 207 is depicted in FIG. 2, it will be understood that such a component can be present in the embodiments illustrated in FIGS. 3-10. In some embodiments of this disclosure, all receiver performance monitor(s) are internal (e.g., 231).

Figure 3:
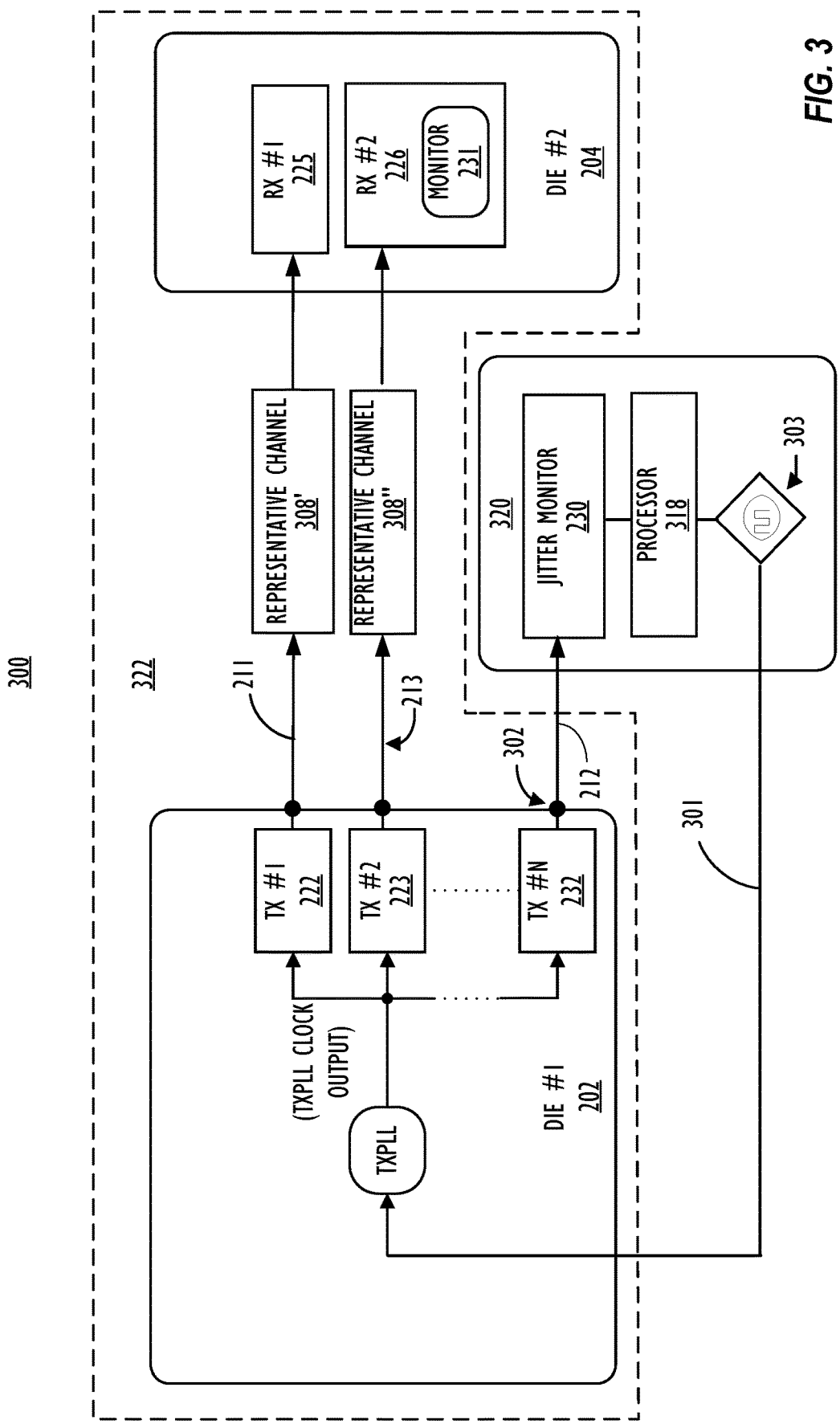
FIG. 3 shows another illustrative embodiment of a method for testing jitter tolerance in a multi-die integrated circuit such as in FIG. 1.

FIG. 3 is a schematic of an example jitter tolerance testing system 300 in which sinusoidal jitter is added to the signal 301 coming from a first signal source 303, while the clock signal for the receivers (e.g., 225, 226) is not subjected to jitter. In other words, while keeping the reference clock of die 204 at a constant frequency, the reference signal 301 for die 202 can be modulated in a sinusoidal fashion and thereby create sinusoidal jitter at the transmitter output(s) 302 of die 202. One transmitter (e.g., 223) sends a jittered signal 213 over a representative channel 308 to a receiver (RX) (e.g., 226) according to a predetermined pattern (e.g., PRBS31). The receiver 226 is used to decode signal 213 and, as in FIG. 2, uses an internal monitor 231 to generate a performance metric such as bit error rate when compared to the predetermined pattern. The receiver (e.g., 226) of these signals (e.g., 213) will see the input from the transmitter 223 once it has passed through a representative channel 308 and the bit error rate (BER) can be measured. In the same time frame, the output 212 from another transmitter (e.g., transmitter #N 232) is sent to a jitter measurement device 230 which measures the jitter in the data signal 212. As different levels of jitter at different frequencies are introduced to the data signals 211, 213, 212, a transfer curve can be derived by measuring the amount of jitter using the jitter measurement device 230 alongside the corresponding bit error rate of the signal 213 emanating from the second transmitter 223. The jitter performance of the system (e.g., 322) is determined by how much jitter a receiver (e.g., 225) can tolerate (as measured by the jitter measurement device 230) before the bit error rate of the system 322 becomes unacceptable (e.g., violates a bit error rate ceiling, such as set by industry standards or customer requirements). By confirming that the difference between the jitter of signal 301 and signal 212 is statistically insignificant, the accuracy of the derived jitter tolerance curve for the DUT (e.g., 204, 226) is confirmed.

Figure 4:
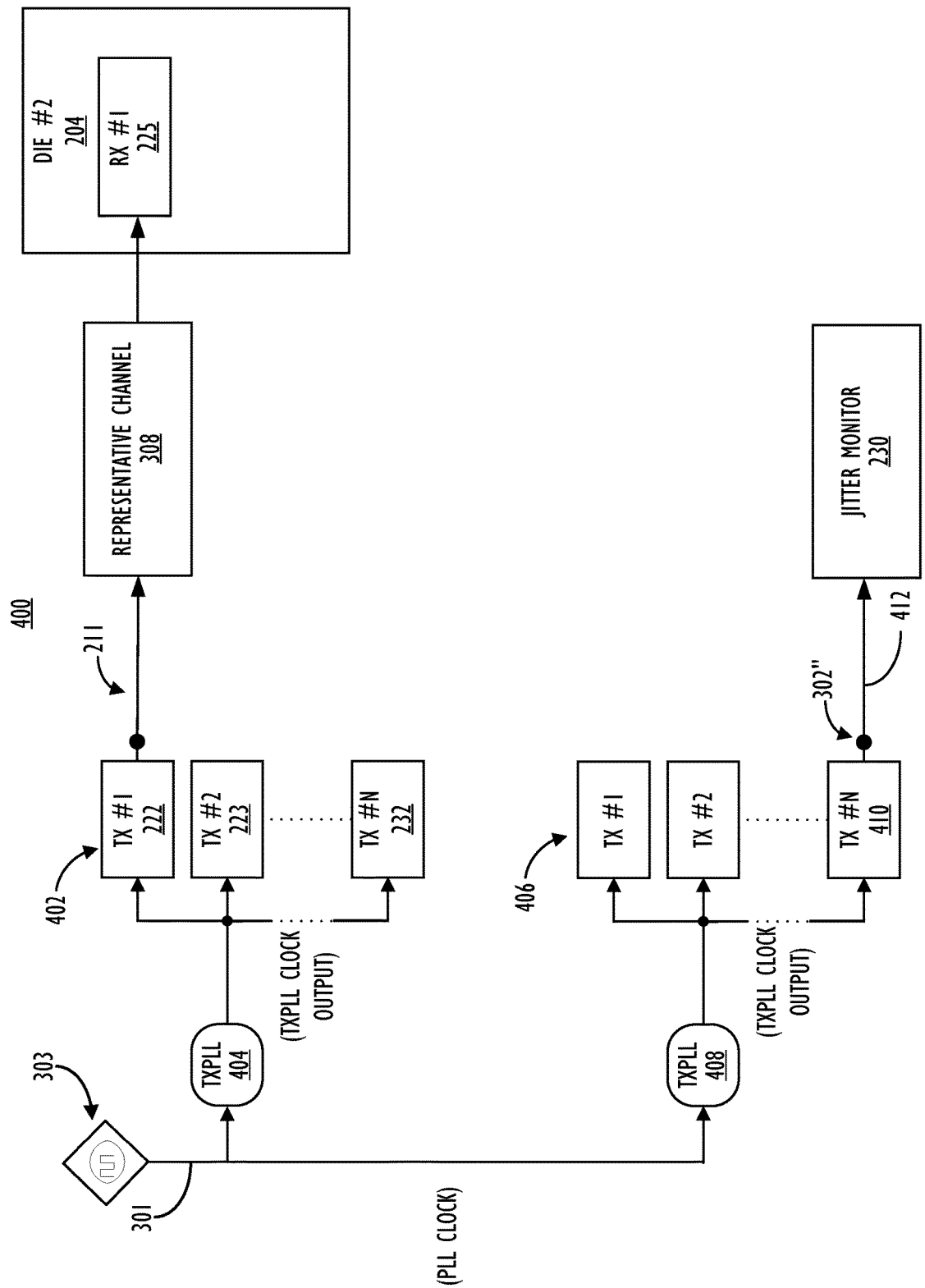
FIGS. 4-10 illustrate additional embodiments of systems for testing for jitter tolerance.

FIG. 4 is a schematic of an example of a jitter tolerance testing system 400 for measuring jitter tolerance in a multi-die package (e.g., 100). A first set of transmitters 402 is driven by a first PLL 404, and a second set of transmitters 406 is driven by a second PLL 408. The first PLL 404 and the second PLL 408 are driven by the same signal 301. In at least one embodiment, a transmitter (e.g., 410) of the second set of transmitters 406 whose output 412 is monitored has a jitter transfer curve which is the same jitter transfer curve as that from the transmitter 222 of the first set of transmitters 402 whose signal 211 is received by the DUT 204 over representative channel 308. Jitter in signal 412 is measured using a jitter monitor (or scope) 230 and used to determine the jitter being added to signal 211. The bit error rate is measured (using a monitor, e.g., 231) for each level and frequency of input jitter to evaluate the jitter tolerance of the DUT 204 as explained in the discussion of jitter tolerance testing system 300.

Figure 5:
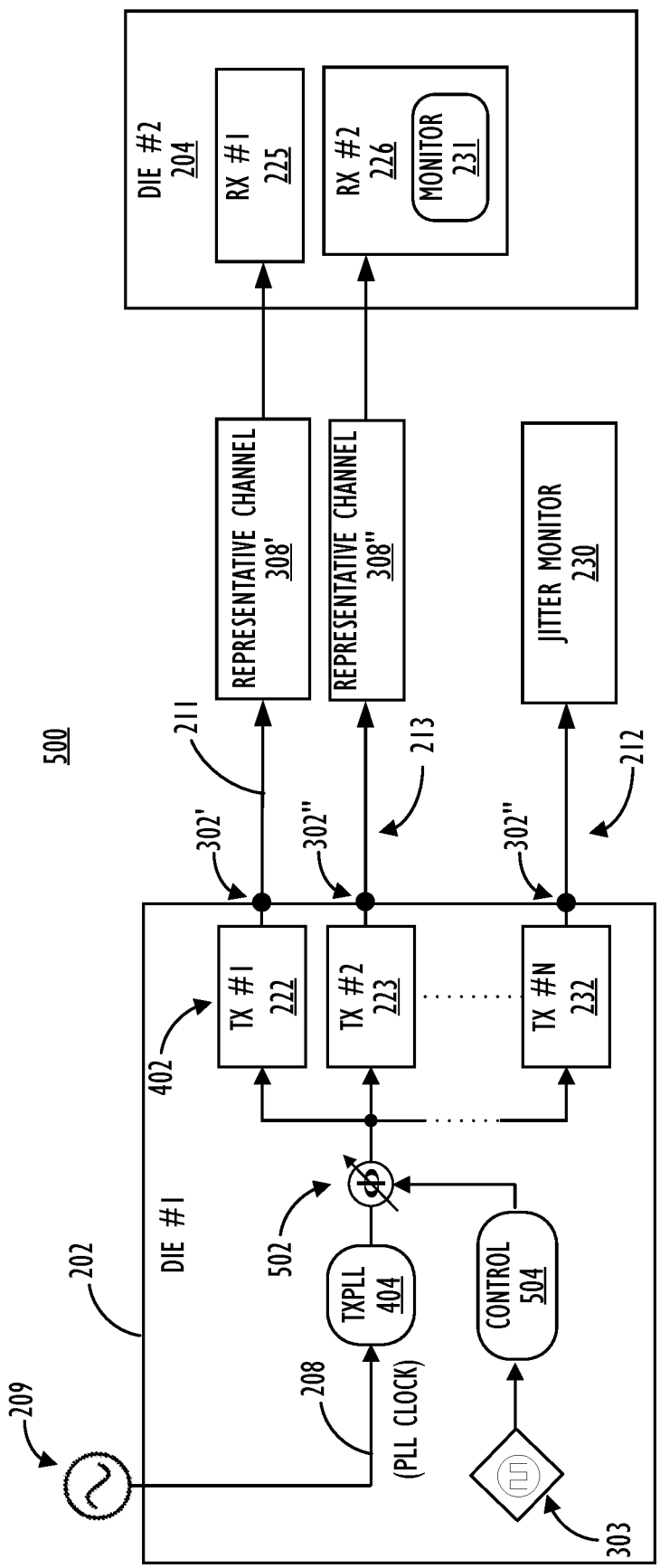

FIG. 5. is a schematic of another example of a jitter tolerance testing system 500. In system 500, a phase rotator circuit 502 is interposed between the PLL 404 and the transmitters 402. As shown in FIG. 5, a function can be added to the control 504 of the phase rotator circuit 502 to enable the phase rotator circuit 502 to add a known amount of sinusoidal jitter (e.g., from jitter generator 303) at various frequencies and with various amplitudes. In some examples, these and other signal characteristics are controlled by hardware and/or software and/or an external control device/system. In FIG. 5, the output(s) 213, 212 of one or more transmitters connected to the same PLL 422 as the transmitter 222 whose output 211 is received by the DUT (e.g., 204, 104) are evaluated for performance in the presence of jitter. As noted, by confirming that the difference between the jitter of the measured signals 213, 212 is statistically insignificant, the accuracy of the derived jitter tolerance curve for the DUT (e.g., 204) is enhanced. In the example shown in FIG. 5, the reference signal source 209 resides outside die 202, but it will be understood by those of skill in the art that the signal source 209 could reside within die 202 in one or more embodiments of this disclosure.

Figure 6:
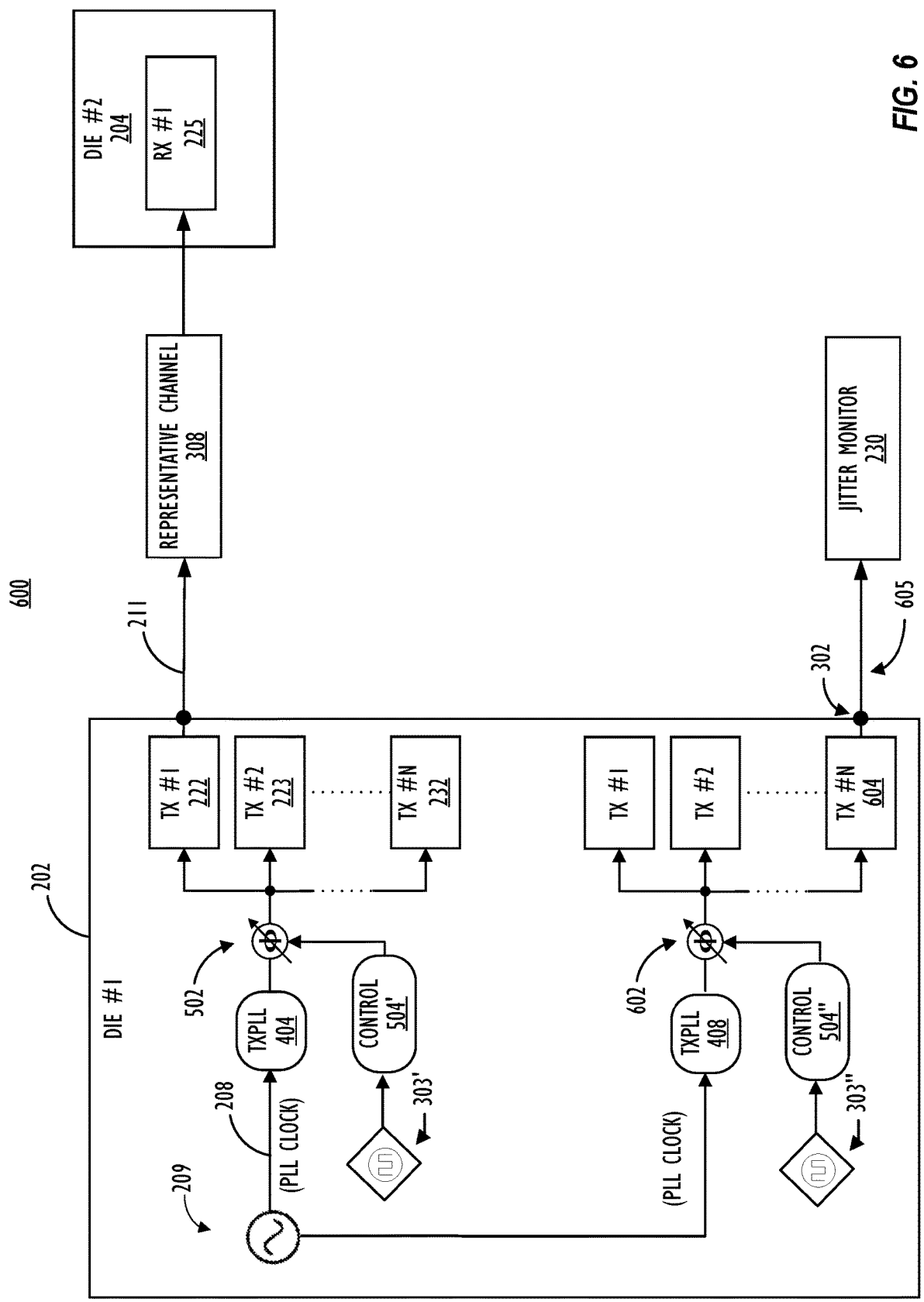

FIG. 6. is a schematic of an embodiment of a jitter tolerance testing system 600. In FIG. 6., a phase rotator circuit 502 is interposed between PLL 404 and a first group of transmitters, and another phase rotator circuit 602 is interposed between PLL 404 and a second group of transmitters. As was noted in the discussion of FIG. 5, a function can be added to the control 504 of the phase rotator circuits 502, 602 to enable the phase rotator circuits 502, 602 to add a known amount of sinusoidal jitter at various frequencies and with various amplitudes. In FIG. 6, the monitored output 605 is from a transmitter 604 that is connected to a different PLL 408 from the transmitter 222 whose output 211 is received by the DUT (204). In the example shown in FIG. 6, the reference signal source 209 resides within die 202, but it will be understood by those of skill in the art that the signal source 209 could reside outside die 202 in one or more embodiments of this disclosure.

Figure 7:
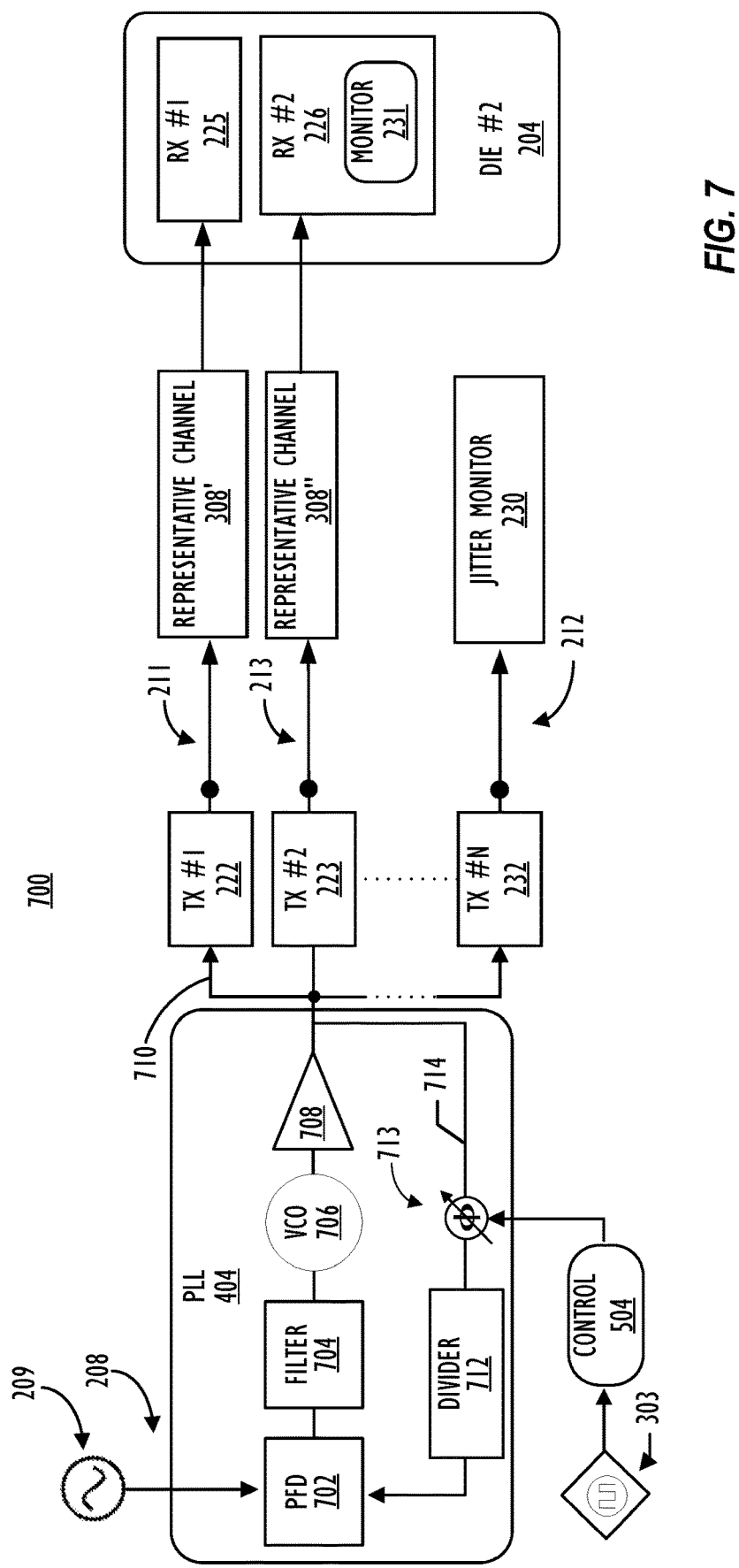

FIG. 7 is a schematic of an example of another jitter tolerance testing system 700 for measuring jitter tolerance in a multi-die package (e.g., 100). In system 700, phase-frequency detector 702 receives signal 208 from reference signal generator 209, and outputs the signal to filter 704. Voltage controlled oscillator 706 receives the output from filter 704 and passes it to buffer 708. The buffered output signal 710 is output to the transmitters and to a phase rotator circuit followed by an integer or fractional divider 712 in the feedback path 714 of PLL 404. In system 700, sinusoidal jitter is generated using a phase rotator 713 before the integer/fractional divider 712 (which may be built into the PLL 404.) In accordance with some embodiments of this disclosure, the phase rotator 713 can be controlled using on-die hardware or on-die software/firmware or an external control that can be used to generate jitter of a certain signature in the PLL output 710. As shown in FIG. 7, the output(s) 212, 213 of one or more transmitters connected to the same PLL 404 as the transmitter 222 whose output 211 is received by the DUT (e.g., 204) are evaluated for performance (e.g., their bit error rate) in the presence of the jitter added using a performance monitor (e.g., 231).

Figure 8:
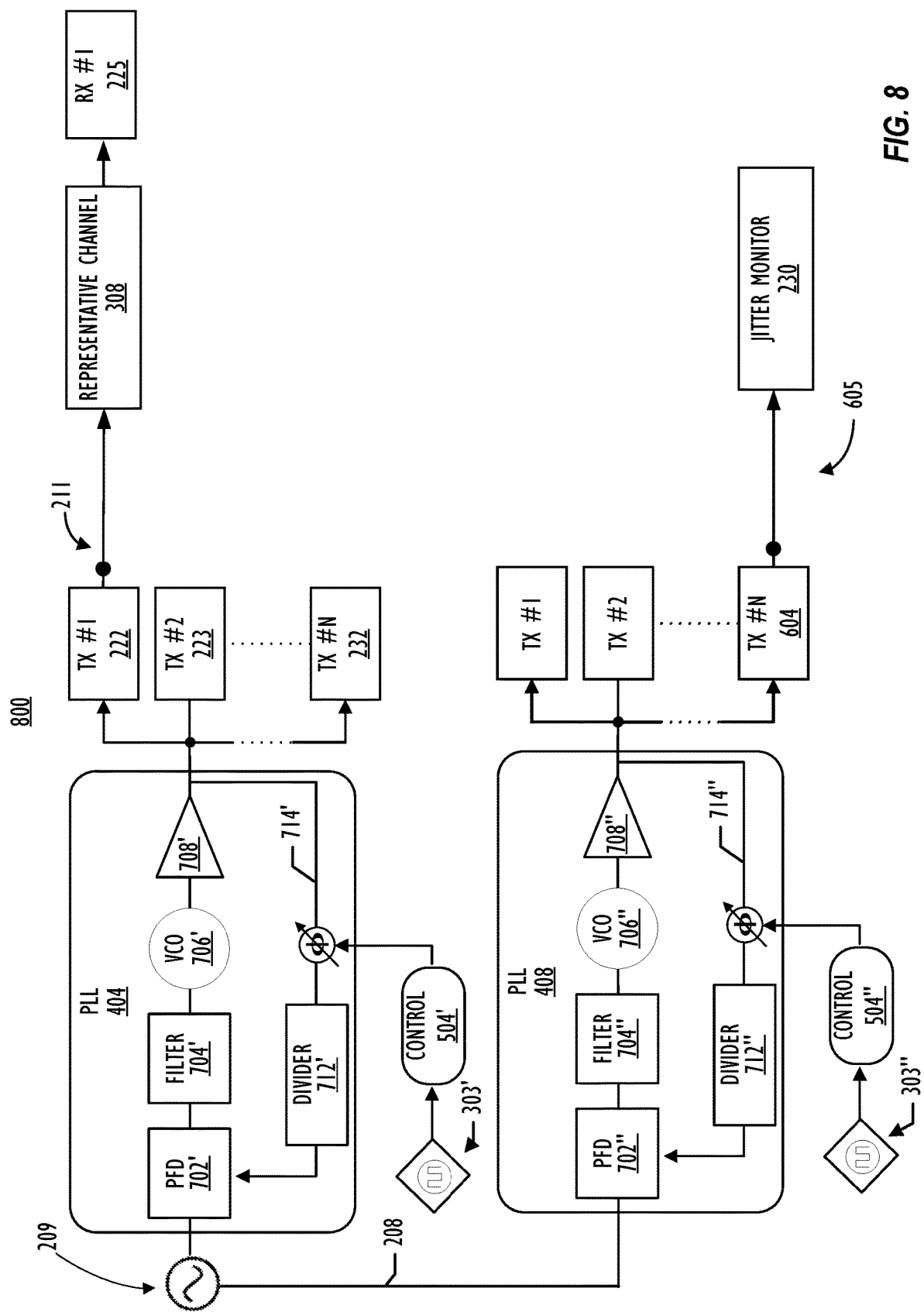

FIG. 8. is a schematic of another example of a jitter tolerance testing system 800 operable to measure jitter tolerance in a multi-die package (e.g., 100). In system 800, phase-frequency detector 702 receives signal 208 from reference signal generator 209, and outputs the signal to filter 704. Voltage controlled oscillator 706 receives the output from filter 704 and passes it to buffer 708. The buffered output signal 710 is output to the transmitters and into a phase rotator that then sends the signal to an integer/fractional divider 712 in the feedback path 714 of PLL 404, 408. In system 800, sinusoidal jitter is generated using the phase rotator (which may be built into the PLL 404.) In FIG. 8, the monitored output 605 is from a transmitter 604 that is connected to a PLL 408 which is similar and representative in terms of performance, function and the jitter transfer curve to the PLL 404 of the transmitter 222 whose output 211 is received by the DUT 225.

Figure 9:
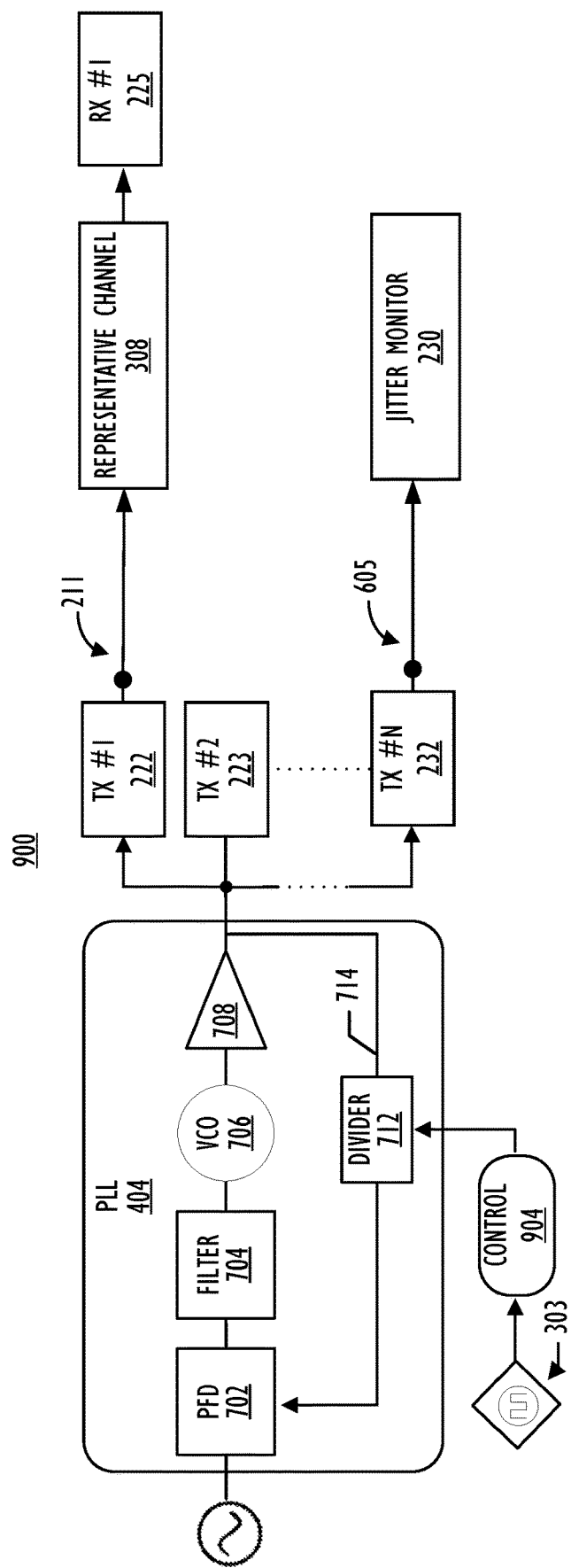

FIG. 9. is a schematic of an example of a jitter tolerance testing system 900 capable measuring jitter tolerance in a multi-die package (e.g., 100). In system 900, phase-frequency detector 702 receive signal 208 from reference signal generator 209, and outputs the signal to filter 704. Voltage controlled oscillator 706 receives the output from filter 704 and passes it to buffer 708. The buffered output signal 710 is output to the transmitters and a fractional divider 712 in the feedback path 714 of PLL 404. In system 900, sinusoidal jitter is generated using the fractional divider 712. The fractional divider 712 is implemented as a modulator controlled by a controller 904 with a jitter signal generator 303 that can be implemented as an on-die hardware control, or on die software/firmware control or an external control. In system 900, the output(s) 211, of one or more transmitters connected to the same PLL 404 as the transmitter 222 whose output 211 is received by the DUT (e.g., 104, 204) are evaluated for performance in the presence of jitter.

Figure 10:
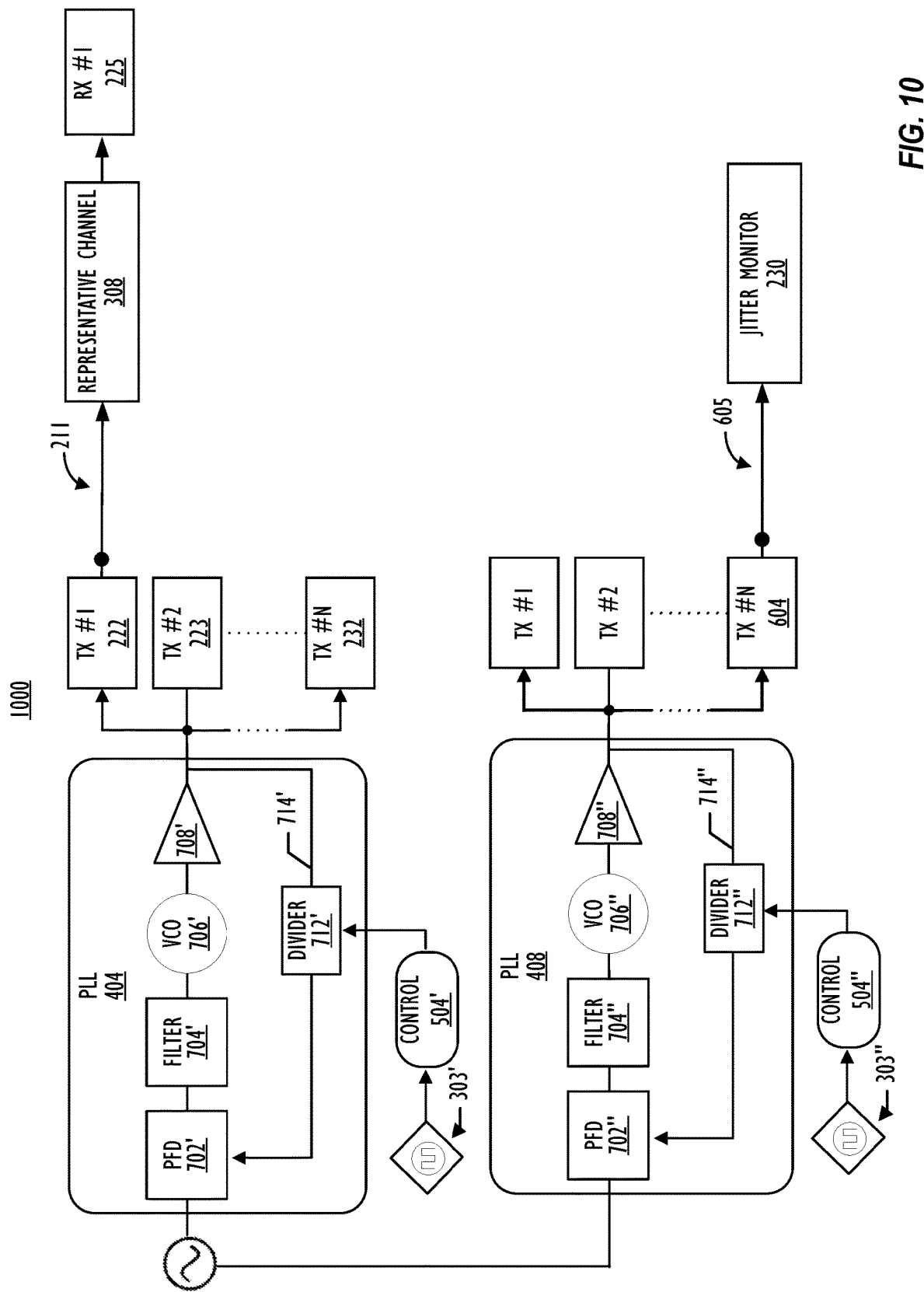

FIG. 10. is a schematic of a further embodiment of a jitter tolerance testing system 1000 that can be used to evaluate jitter tolerance in a multi-die package (e.g., 100). In system 1000, phase-frequency detectors 702 receive signal 208 from reference signal generator 209 and output the signal to filters 704. Voltage controlled oscillators 706 receive the output from filters 704 and passes it to buffers 708. The buffered output signals 710 are output to the transmitters and the fractional dividers 712 in the feedback paths 714 of PLL 404 and PLL 408. In system 1000, sinusoidal jitter is generated using the fractional dividers 712. The fractional dividers 712 are implemented as modulators controlled by controllers 504 based on a sinusoidal jitter signal from a jitter signal generator 303. As shown in FIG. 10, the monitored output 314 is from a transmitter 604 that is connected to a second PLL 408 which is similar and representative in terms of performance, function and the jitter transfer curve to the PLL 404 of the transmitter 222 whose output 211 is received by the DUT 225.

Figure 11:
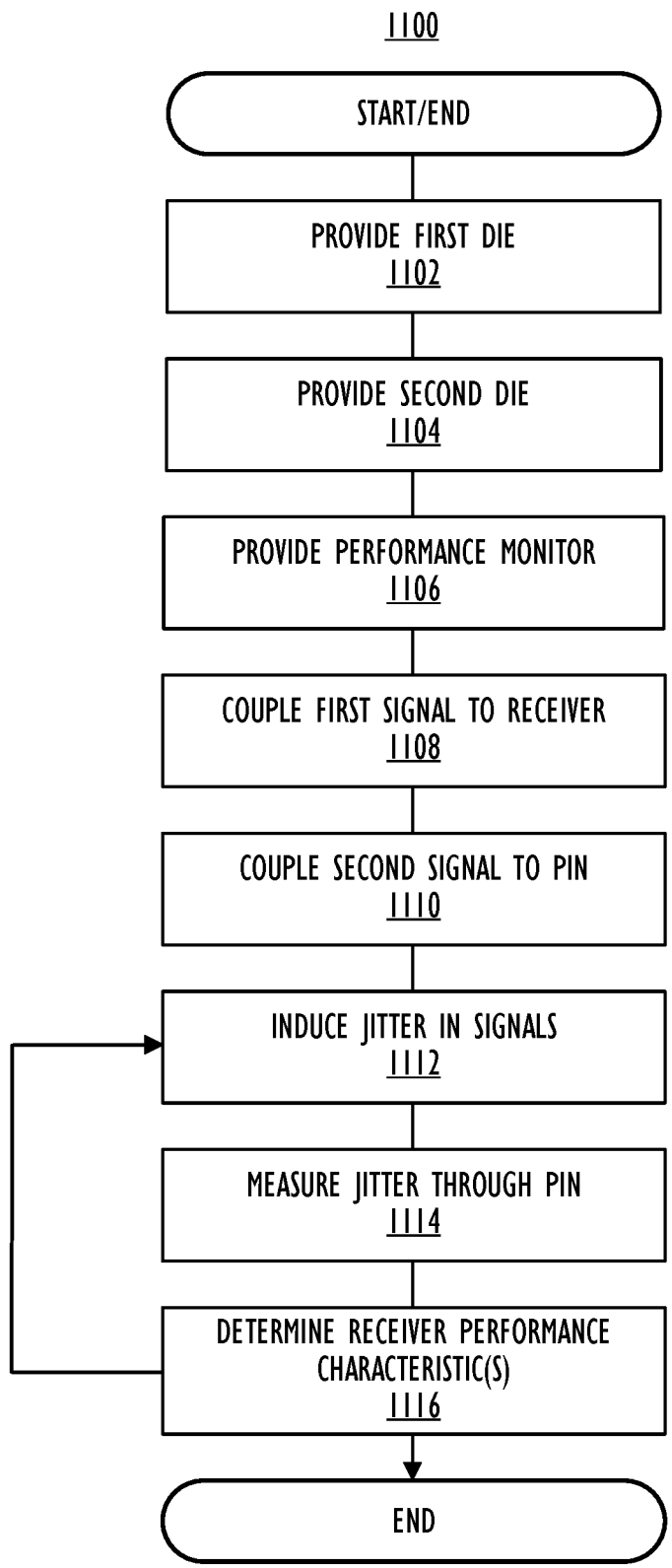
FIG. 11 illustrates a methods of measuring jitter tolerance in a multi-die package.

FIG. 11 illustrates a method 1100 of assessing the ability of one or more multi-die circuit elements (e.g., 225) to perform in the presence of jitter in intra-package signals. The method 1100 includes: providing 1102 a first die (e.g., 202) having a set of transmitters (e.g., 220) for digital communications, the set of transmitters comprising a first transmitter (e.g., 222) and a second transmitter (e.g., 232); providing 1104 a second die (e.g., 204) having a set of receivers (e.g., 224) for digital communications; providing 1106 a performance monitor (e.g., 230); coupling 1108, using an intra-package trace (e.g., 206, 207), a first transmit signal (e.g., 213) from the first transmitter to a receiver (e.g., 226) of the set of receivers; coupling 1110 a second transmit signal (e.g., 212) from the second transmitter to an external pin (e.g., 302); supplying 1112 an input signal that induces jitter in the first and second transmit signals; measuring 1114 jitter in the second transmit signal via the external pin; and determining 1116—using the performance monitor—a performance characteristic of the second die.

Examples of this disclosure also include the following embodiments:

1. A jitter tolerance testing method (1100) that comprises: providing (1102) a first die (202) having a set of transmitters (220) for digital communications, the set of transmitters (220) comprising a first transmitter (222) and a second transmitter (223, 410); providing (1104) a second die (204) having a set of receivers (224) for digital communications; providing (1106) a performance monitor (230); coupling, using an intra-package trace (206, 207), a first transmit signal (211) from the first transmitter (222) to a receiver (225) of the set of receivers (224) coupling a second transmit signal (212, 213, 412) from the second transmitter (223, 410) to an external pin (302); supplying an input signal (302) that induces jitter in the first and second transmit signals; measuring jitter in the second transmit signal (212, 213, 412) via the external pin (302); and determining, using the performance monitor (230), a performance characteristic of the second die (204).

2. The jitter tolerance testing method (1100) of embodiment 1, wherein the input signal (302) is a reference signal (208) with controllable sinusoidal jitter, and the first die (202) includes a phase lock loop (e.g., 404) that converts the reference signal (e.g., 208) into a symbol clock signal for the first transmitter (e.g., 222) and the second transmitter (e.g., 223, 410).

3. The jitter tolerance testing method (e.g., 1100) of embodiment 1, wherein the input signal (e.g., 302) is a reference signal (e.g., 208) with controllable sinusoidal jitter, and the first die (e.g., 202) includes a first phase lock loop (e.g., 404) that converts the reference signal (e.g., 208) into a first symbol clock signal for the first transmitter (e.g., 222) and a second phase lock loop (e.g., 408) that converts the reference signal (e.g., 208) into a second symbol clock signal for the second transmitter (e.g., 410), wherein the first phase lock loop and the second phase lock loop are configured to introduce equivalent jitter in the first symbol clock signal and the second symbol clock signal.

4. The jitter tolerance testing method (e.g., 1100) of embodiment 1, wherein the input signal (e.g., 302) is a phase control signal for a phase rotator that operates to modify a phase of a sample clock signal for the first and second transmitters (e.g., 222, 410).

5. The jitter tolerance testing method (e.g., 1100) of embodiment 1, wherein the input signal (e.g., 302) is a phase control signal for a first phase rotator that operates to modify a phase of a first sample clock signal for the first transmitter (e.g., 222) and wherein the input signal (e.g., 302) is a phase control signal for a second phase rotator that operates to modify a phase of a second sample clock signal for the second transmitter.

6. The jitter tolerance testing method (e.g., 1100) of embodiment 1, wherein the input signal (e.g., 302) is a divider control signal for a multi-modulus divider in a first phase lock loop (e.g., 404) that converts a reference signal (e.g., 208) into a symbol clock signal for the first transmitter (e.g., 222) and the second transmitter.

7. The jitter tolerance testing method (e.g., 1100) of embodiment 1, wherein the input signal (e.g., 301) is a divider control signal for a first multi-modulus divider in a first phase lock loop (e.g., 404) and a second multi-modulus divider in a second phase lock loop (e.g., 408), wherein the first multi-modulus divider converts a reference signal (e.g., 208) into a first symbol clock signal for the first transmitter, and the second multi-modulus divider converts the reference signal (e.g., 208) into a second symbol clock signal for the second transmitter.

8. The jitter tolerance testing method (e.g., 1100) of embodiment 1, wherein the input signal (e.g., 301) is a phase control signal for a phase rotator in a first phase lock loop (e.g., 404) that converts a reference signal (e.g., 208) into a symbol clock signal for the first and second transmitters (e.g., 222, 410).

9. The jitter tolerance testing method (e.g., 1100) of embodiment 1, wherein the input signal (e.g., 301) is a phase control signal for a first phase rotator in a first phase lock loop (e.g., 404) and a second phase rotator in a second phase lock loop (e.g., 408), wherein the first phase rotator converts a reference signal (e.g., 208) into a first symbol clock signal for the first transmitter, and the second phase lock loop (e.g., 408) converts the reference signal (e.g., 208) into a second symbol clock signal for the second transmitter.

10. The jitter tolerance testing method (e.g., 1100) of embodiment 1, wherein the jitter has a sinusoidal phase variation with an amplitude and frequency, and wherein measuring jitter in the second transmit signal (e.g., 212, 213, 605, 412) via the external pin (e.g., 302) includes determining the amplitude and the frequency associated with controllable parameters of the input signal (e.g., 301).

11. The jitter tolerance testing method (e.g., 1100) of embodiment 10, further comprising determining a dependence of the performance characteristic on at least one of the amplitude or frequency associated with controllable parameters of the input signal (e.g., 301).

12. The jitter tolerance testing method (e.g., 1100) of embodiment 1, further comprising determining amplitude and frequency values at which the performance characteristic crosses a predefined threshold, wherein the performance characteristic is one of bit error rate, symbol error rate, or mean square error rate.

13. A jitter tolerance testing system that comprises: a package; and a test controller (320), the package including: a first die (e.g., 202) having a first transmitter (e.g., 222) and a second transmitter; a second die (e.g., 204) having a receiver (e.g., 225, 226) and a performance monitor (e.g., 230); a signal path coupling a first transmit signal (e.g., 211) from the first transmitter (e.g., 222) to the receiver (e.g., 225, 226); and an external pin (e.g., 302) making a second transmit signal (e.g., 212, 213, 605, 412) from the second transmitter (e.g., 223, 410) available to the test controller (320), and the test controller (320) including: a signal generator (303) that supplies an input signal (e.g., 301) to the package to induce jitter in the first and second transmit signals; a jitter measurement circuit that measures jitter in the second transmit signal (e.g., 212, 213, 605, 412); and a processor that controls the input signal (e.g., 301), obtains the measured jitter from jitter measurement circuit, and obtains a performance indicator signal from the performance monitor (e.g., 230), the performance indicator signal indicative of an ability of one or more components of the second die (e.g., 204) to retrieve data from the first transmit signal (e.g., 211) despite the jitter.

14. The jitter tolerance testing system of embodiment 13, wherein the signal path coupling the first transmit signal (e.g., 211) from the first transmitter (e.g., 223) to the receiver (e.g., 226) comprises an intra-package trace (e.g., 207).

15. The jitter tolerance testing system of embodiment 13, wherein the input signal (e.g., 301) is a reference signal (e.g., 208) with controllable sinusoidal jitter, and the first die (e.g., 202) includes a phase lock loop (e.g., 404) that converts the reference signal (e.g., 208) into a symbol clock signal for the first transmitter (e.g., 222) and the second transmitter.

16. The jitter tolerance testing system of embodiment 13, wherein the input signal (e.g., 301) is a reference signal (e.g., 208) with controllable sinusoidal jitter, and the first die (e.g., 202) includes a first phase lock loop (e.g., 404) that converts the reference signal (e.g., 208) into a first symbol clock signal for the first transmitter (e.g., 222) and a second phase lock loop (e.g., 408) that converts the reference signal (e.g., 208) into a second symbol clock signal for the second transmitter.

17. The jitter tolerance testing system of embodiment 13, the package further including a phase rotator and a sample clock signal generator that generates a sample clock signal, and wherein the input signal (e.g., 301) is a phase control signal for the phase rotator that operates to modify a phase of the sample clock signal for the first and second transmitters (e.g., 222, 410).

18. The jitter tolerance testing system of embodiment 13, the package further including a first phase rotator, a second phase rotator, and a sample clock signal generator that generates a first sample clock signal and a second sample clock signal, and wherein the input signal (e.g., 301) is a phase control signal for the first phase rotator that operates to modify a phase of the first sample clock signal for the first transmitter (e.g., 222) and wherein the input signal (e.g., 301) is a phase control signal for the second phase rotator that operates to modify a phase of the second sample clock signal for the second transmitter.

19. The jitter tolerance testing system of embodiment 13, the package further including phase lock loop (e.g., 404) with a multi-modulus divider, and wherein the input signal (e.g., 301) is a divider control signal for the multi-modulus divider in the phase lock loop (e.g., 404) that converts a reference signal (e.g., 208) into a symbol clock signal for the first transmitter (e.g., 222) and the second transmitter.

20. The jitter tolerance testing system of embodiment 13, the package further including a first phase lock loop (e.g., 404) with a first multi-modulus divider, and a second phase lock loop (e.g., 408) with a second multi-modulus divider, and wherein the input signal (e.g., 301) is a divider control signal for the first multi-modulus divider and the second multi-modulus divider, and the first multi-modulus divider converts a reference signal (e.g., 208) into a first symbol clock signal for the first transmitter, and the second multi-modulus divider converts the reference signal (e.g., 208) into a second symbol clock signal for the second transmitter.

21. The jitter tolerance testing system of embodiment 13, the package further including a phase lock loop (e.g., 404) with a phase rotator, and wherein the input signal (e.g., 301) is a phase control signal for the phase rotator and the phase lock loop (e.g., 404) that converts a reference signal (e.g., 208) into a symbol clock signal for the first and second transmitters (e.g., 222, 410).

22. The jitter tolerance testing system of embodiment 13, the package further including a first phase lock loop (e.g., 404) with a first phase rotator and a second phase lock loop (e.g., 408) with a second phase rotator, wherein the input signal (e.g., 301) is a phase control signal for the first phase rotator and the second phase rotator, the first phase rotator converts a reference signal (e.g., 208) into a first symbol clock signal for the first transmitter, and the second phase lock loop converts the reference signal (e.g., 208) into a second symbol clock signal for the second transmitter.

23. The jitter tolerance testing system of embodiment 13, wherein the jitter has a sinusoidal phase variation with an amplitude and frequency, and wherein the processor further determines the amplitude and the frequency associated with controllable parameters of the input signal (e.g., 301).

24. The jitter tolerance testing system of embodiment 23, wherein the processor further determines a dependence of the performance indicator signal on at least one of the amplitude or frequency associated with controllable parameters of the input signal (e.g., 301).

25. The jitter tolerance testing system of embodiment 13, wherein the processor further determines amplitude and frequency values at which the performance indicator signal crosses a predefined threshold, and wherein the performance indicator signal corresponds to at least one of a bit error rate, a symbol error rate, or a mean square error rate.

26. A jitter tolerance testing system that comprises: a first die (e.g., 202) having a transmitter (e.g., 222); a second die (e.g., 204) having a receiver (e.g., 226) and a performance monitor (e.g., 230); a signal path coupling a transmit signal (e.g., 211) from the transmitter (e.g., 222) to the receiver (e.g., 226), the signal path configured to mimic a predetermined degree of cross talk or a predetermined degree of insertion loss; a signal generator that supplies an input (reference) signal (e.g., 208) to induce the transmitter (e.g., 223) to transmit the transmit signal (e.g., 213) to the receiver (e.g., 226); and a processor that controls the input signal (e.g., 208) and obtains a performance indicator signal from the performance monitor (e.g., 230), the performance indicator signal indicative of an ability of one or more components of the second die (e.g., 204) to retrieve data from the transmit signal (e.g., 211) despite the cross talk or the insertion loss.

27. A jitter tolerance testing method that comprises: providing (e.g., 1102) a first die (e.g., 202) having a transmitter (e.g., 222); providing (e.g., 1104) a second die (e.g., 204) having a set of receivers (e.g., 224) for digital communications; providing (e.g., 1106) a performance monitor (e.g., 230); configuring an intra-package trace (e.g., 207) to mimic a predetermined degree of cross talk or a predetermined degree of insertion loss; supplying an input signal (e.g., 208) that causes the transmitter (e.g., 222) to emit a transmit signal (e.g., 211); coupling, using the intra-package trace (e.g., 206, 207), the transmit signal (e.g., 211) from the transmitter (e.g., 222) to a receiver (e.g., 225) of the set of receivers (e.g., 224); and determining, using the performance monitor (e.g., 230), a performance characteristic of the second die (e.g., 204).

The embodiments described are illustrative and non-limiting. Numerous other modifications, equivalents, and alternatives will become apparent to those of ordinary skill in the art once the above disclosure is fully appreciated. It is intended that the following claims be interpreted to embrace all such modifications, equivalents, and alternatives where applicable.

It is claimed:

1. A jitter tolerance testing method that comprises:
    providing a first die having a set of transmitters for digital communications, the set of transmitters comprising a first transmitter and a second transmitter;
    providing a second die having a set of receivers for digital communications, at least one of the receivers comprising a performance monitor;
    coupling, using an intra-package trace, a first transmit signal from the first transmitter to a receiver of the set of receivers;
    coupling a second transmit signal from the second transmitter to an external pin;
    supplying an input signal that induces jitter in the first and second transmit signals;
    measuring jitter in the second transmit signal via the external pin; and
    determining, using the performance monitor, a performance characteristic of the second die.

2. The jitter tolerance testing method of claim 1, wherein the input signal is a reference signal with controllable sinusoidal jitter, and the first die includes a phase lock loop that converts the reference signal into a symbol clock signal for the first transmitter and the second transmitter.

3. The jitter tolerance testing method of claim 1, wherein the input signal is a reference signal with controllable sinusoidal jitter, and the first die includes a first phase lock loop that converts the reference signal into a first symbol clock signal for the first transmitter and a second phase lock loop that converts the reference signal into a second symbol clock signal for the second transmitter, wherein the first phase lock loop and the second phase lock loop are configured to introduce equivalent jitter in the first symbol clock signal and the second symbol clock signal.

4. The jitter tolerance testing method of claim 1, wherein the input signal is a phase control signal for a phase rotator that operates on output of a transmitter phase lock loop to modify a phase of a sample clock signal for the first and second transmitters.

5. The jitter tolerance testing method of claim 1, wherein the input signal is a phase control signal for a first phase rotator that operates to modify a phase of a first sample clock signal for the first transmitter and wherein the input signal is a phase control signal for a second phase rotator that operates to modify a phase of a second sample clock signal for the second transmitter, wherein the first phase rotator and the second phase rotator are configured to introduce equivalent jitter in the first sample clock signal and the second sample clock signal.

6. The jitter tolerance testing method of claim 1, wherein the input signal is a divider control signal for a multi-modulus divider in a first phase lock loop that converts a reference signal into a symbol clock signal for the first transmitter and the second transmitter.

7. The jitter tolerance testing method of claim 1, wherein the input signal is a divider control signal for a first multi-modulus divider in a first phase lock loop and a second multi-modulus divider in a second phase lock loop, wherein the first multi-modulus divider converts a reference signal into a first symbol clock signal for the first transmitter, and the second multi-modulus divider converts the reference signal into a second symbol clock signal for the second transmitter, wherein the first phase lock loop and the second phase lock loop are configured to introduce equivalent jitter in the first symbol clock signal and the second symbol clock signal.

8. The jitter tolerance testing method of claim 1, wherein the input signal is a phase control signal for a phase rotator in a feedback path of a first phase lock loop that converts a reference signal into a symbol clock signal for the first and second transmitters.

9. The jitter tolerance testing method of claim 1, wherein the input signal is a phase control signal for a first phase rotator in a first feedback path of a first phase lock loop and a second phase rotator in a second feedback path of a second phase lock loop, wherein the first phase rotator converts a reference signal into a first symbol clock signal for the first transmitter, and the second phase lock loop converts the reference signal into a second symbol clock signal for the second transmitter.

10. The jitter tolerance testing method of claim 1, wherein the jitter has a sinusoidal phase variation with an amplitude and frequency, and wherein measuring jitter in the second transmit signal via the external pin includes determining the amplitude and the frequency of a sinusoidal phase variation associated with controllable parameters of the input signal.

11. The jitter tolerance testing method of claim 10, further comprising determining a dependence of a performance characteristic of one or more receivers on at least one of the amplitude or frequency associated with controllable parameters of the input signal.

12. The jitter tolerance testing method of claim 1, further comprising determining amplitude and frequency values at which a performance characteristic of one or more receivers crosses a predefined threshold, wherein the performance characteristic is one of bit error rate, symbol error rate, or mean square error rate.

13. A jitter tolerance testing system that comprises:
a package; and
a test controller,
the package including:
a first die having a first transmitter and a second transmitter;
a second die having a receiver and a performance monitor;
a signal path coupling a first transmit signal from the first transmitter to the receiver; and
an external pin making a second transmit signal from the second transmitter available to the test controller, and
the test controller including:
a signal generator that supplies an input signal to the package to induce jitter in the first and second transmit signals;
a jitter measurement circuit that measures jitter in the second transmit signal; and
a processor that controls the input signal, obtains the measured jitter from jitter measurement circuit, and obtains a performance indicator signal from the performance monitor, the performance indicator signal indicative of an ability of one or more components of the second die to retrieve data from the first transmit signal despite the jitter.

14. The jitter tolerance testing system of claim 13, wherein the signal path coupling the first transmit signal from the first transmitter to the receiver comprises an intra-package trace.

15. The jitter tolerance testing system of claim 13, wherein the input signal is a reference signal with controllable sinusoidal jitter, and the first die includes a phase lock loop that converts the reference signal into a symbol clock signal for the first transmitter and the second transmitter.

16. The jitter tolerance testing system of claim 13, wherein the input signal is a reference signal with controllable sinusoidal jitter, and the first die includes a first phase lock loop that converts the reference signal into a first symbol clock signal for the first transmitter and a second phase lock loop that converts the reference signal into a second symbol clock signal for the second transmitter.

17. The jitter tolerance testing system of claim 13, the package further including a phase rotator and a sample clock signal generator that generates a sample clock signal, and wherein the input signal is a phase control signal for the phase rotator that operates to modify a phase of the sample clock signal for the first and second transmitters.

18. The jitter tolerance testing system of claim 13, the package further including a first phase rotator, a second phase rotator, and a sample clock signal generator that generates a first sample clock signal and a second sample clock signal, and wherein the input signal is a phase control signal for the first phase rotator that operates to modify a phase of the first sample clock signal for the first transmitter and wherein the input signal is a phase control signal for the second phase rotator that operates to modify a phase of the second sample clock signal for the second transmitter.

19. The jitter tolerance testing system of claim 13, the package further including phase lock loop with a multi-modulus divider, and wherein the input signal is a divider control signal for the multi-modulus divider in the phase lock loop that converts a reference signal into a symbol clock signal for the first transmitter and the second transmitter.

20. The jitter tolerance testing system of claim 13, the package further including a first phase lock loop with a first multi-modulus divider, and a second phase lock loop with a second multi-modulus divider, and wherein the input signal is a divider control signal for the first multi-modulus divider and the second multi-modulus divider, and the first multi-modulus divider converts a reference signal into a first symbol clock signal for the first transmitter, and the second multi-modulus divider converts the reference signal into a second symbol clock signal for the second transmitter.

21. The jitter tolerance testing system of claim 13, the package further including a phase lock loop with a phase rotator, and wherein the input signal is a phase control signal for the phase rotator and the phase lock loop that converts a reference signal into a symbol clock signal for the first and second transmitters.

22. The jitter tolerance testing system of claim 13, the package further including a first phase lock loop having a first phase rotator in a feedback path of the first phase lock loop and a second phase lock loop having a second phase rotator in a second feedback path of the second phase lock loop, wherein the input signal is a phase control signal for the first phase rotator and the second phase rotator, the first phase rotator converts a reference signal into a first symbol clock signal for the first transmitter, and the second phase lock loop converts the reference signal into a second symbol clock signal for the second transmitter.

23. The jitter tolerance testing system of claim 13, wherein the jitter has a sinusoidal phase variation with an amplitude and frequency, and wherein the processor further determines the amplitude and the frequency associated with controllable parameters of the input signal.

24. The jitter tolerance testing system of claim 23, wherein the processor further determines a dependence of the performance indicator signal of the receiver on at least one of the amplitude or frequency associated with controllable parameters of the input signal.

25. The jitter tolerance testing system of claim 13, wherein the processor further determines amplitude and frequency values at which the performance indicator signal of the receiver crosses a predefined threshold, and wherein the performance indicator signal corresponds to at least one of a bit error rate, a symbol error rate, or a mean square error rate.

26. A jitter tolerance testing system that comprises:
a first die having a transmitter;
a second die having a receiver and a performance monitor;
a signal path coupling a transmit signal from the transmitter to the receiver, the signal path configured to mimic a predetermined degree of cross talk or a predetermined degree of insertion loss;
a signal generator that supplies an input signal to induce the transmitter to transmit the transmit signal to the receiver; and
a processor that controls the input signal and obtains a performance indicator signal from the performance monitor, the performance indicator signal indicative of an ability of one or more components of the second die to retrieve data from the transmit signal despite the cross talk or the insertion loss.

27. A jitter tolerance testing method that comprises:
providing a first die having a transmitter;
providing a second die having a set of receivers for digital communications;
providing a performance monitor;
configuring an intra-package trace to mimic a predetermined degree of cross talk or a predetermined degree of insertion loss;
supplying an input signal that causes the transmitter to emit a transmit signal;
coupling, using the intra-package trace, the transmit signal from the transmitter to a receiver of the set of receivers; and
determining, using the performance monitor, a performance characteristic of the second die.

\* \* \* \* \*